(12) United States Patent
Hao et al.

(10) Patent No.: US 12,114,525 B2
(45) Date of Patent: Oct. 8, 2024

(54) OLED DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Xueguang Hao, Beijing (CN); Yong Qiao, Beijing (CN); Xinyin Wu, Beijing (CN); Hongfei Cheng, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 943 days.

(21) Appl. No.: 17/052,092

(22) PCT Filed: Apr. 11, 2020

(86) PCT No.: PCT/CN2020/084344
§ 371 (c)(1),
(2) Date: Oct. 30, 2020

(87) PCT Pub. No.: WO2020/233277
PCT Pub. Date: Nov. 26, 2020

(65) Prior Publication Data
US 2023/0096411 A1    Mar. 30, 2023

(30) Foreign Application Priority Data
May 17, 2019  (CN) .......................... 201920716235.9

(51) Int. Cl.
*H10K 50/86* (2023.01)
*H10K 59/122* (2023.01)
(Continued)

(52) U.S. Cl.
CPC ........ *H10K 50/865* (2023.02); *H10K 59/122* (2023.02); *H10K 59/131* (2023.02); *H10K 59/38* (2023.02)

(58) Field of Classification Search
CPC .... H10K 50/865; H10K 59/00; H10K 59/122; H10K 59/131; H10K 59/38; H10K 59/8791
See application file for complete search history.

(56) References Cited

U.S. PATENT DOCUMENTS

2011/0234956 A1   9/2011  Umezawa
2014/0009704 A1   1/2014  Pijlman et al.
(Continued)

FOREIGN PATENT DOCUMENTS

CN   204271085 U   4/2015
CN   106601769 A   4/2017
(Continued)

OTHER PUBLICATIONS

Google Translation of WO-2020056809-A1; 2020.*
(Continued)

*Primary Examiner* — Omar F Mojaddedi
(74) *Attorney, Agent, or Firm* — ArentFox Schiff LLP; Michael Fainberg

(57) ABSTRACT

Disclosed are an OLED display panel and a display device. The OLED display panel includes a substrate, a plurality of light emitting components arranged in an array, and a light resistance structure between the light emitting components. The light resistance structure prevents the reflected light of the emergent light from the light emitting components, from emitting out from one side of the substrate between the light emitting components.

16 Claims, 4 Drawing Sheets

(51) Int. Cl.
H10K 59/131 (2023.01)
H10K 59/38 (2023.01)

(56) References Cited

U.S. PATENT DOCUMENTS

| | | | |
|---|---|---|---|
| 2016/0190218 A1 | 6/2016 | Jeong et al. | |
| 2017/0110522 A1* | 4/2017 | Lee .................. | H10K 50/856 |
| 2017/0186823 A1 | 6/2017 | Kim et al. | |
| 2018/0190751 A1 | 7/2018 | Lee et al. | |
| 2018/0301521 A1* | 10/2018 | Yang .................. | H10K 59/35 |
| 2019/0103442 A1 | 4/2019 | Choi et al. | |
| 2019/0319220 A1 | 10/2019 | Hirasawa | |
| 2021/0066398 A1* | 3/2021 | Huang ................ | H10K 59/131 |

FOREIGN PATENT DOCUMENTS

| | | | | |
|---|---|---|---|---|
| CN | 106876331 | A | 6/2017 | |
| CN | 106920891 | A | 7/2017 | |
| CN | 108630733 | A | 10/2018 | |
| CN | 109346502 | A | 2/2019 | |
| CN | 209626221 | U | 11/2019 | |
| JP | 2016045307 | A | 4/2016 | |
| KR | 20120045470 | A | 5/2012 | |
| KR | 20170045460 | A | 4/2017 | |
| KR | 20170077887 | A | 7/2017 | |
| KR | 10-2017-0125485 | A | 11/2017 | |
| RU | 2474006 | C1 | 1/2013 | |
| RU | 2598971 | C2 | 10/2016 | |
| WO | 2017221424 | A1 | 12/2017 | |
| WO | WO-2020056809 | A1 * | 3/2020 | ......... H01L 27/3246 |
| WO | 2020233277 | A1 | 11/2020 | |

OTHER PUBLICATIONS

Russian Office Action for 2020139882 issued on Mar. 29, 2021.
Office Action in JP2020550777, mailed Jan. 16, 2024, 5 pages.
Office Action received for Japanese Patent Application No. 2020-550777, mailed on Jul. 9, 2024, 14 pages (7 pages of English Translation and 7 pages of Original Document).

* cited by examiner

OLED DISPLAY PANEL AND DISPLAY DEVICE

CROSS REFERENCE TO RELATED APPLICATION

The present disclosure is a national phase entry under 35 U.S.C. § 371 of International Application No. PCT/CN2020/084344, filed on Apr. 11, 2020, which claims priority of Chinese patent application No. 201920716235.9 filed on May 17, 2019 to the Chinese Patent Office and titled "OLED DISPLAY PANEL AND DISPLAY DEVICE", the entire contents of which are incorporated herein by reference.

FIELD

The present disclosure relates to the technical field of display, and particularly relates to an OLED display panel and a display device.

BACKGROUND

At present, most of organic light-emitting diode (OLED) display panels have a problem of light leakage. For example, in a related design, in an OLED display panel adopting an RGBW pixel arrangement mode, a certain light leakage condition occurs between an R light emitting component and a W light emitting component, between a W light emitting component and a B light emitting component, between the B light emitting component and a G light emitting component, and between the G light emitting component and the R light emitting component. How to solve the light leakage problem is a technical problem to be solved in this field.

SUMMARY

An embodiment of the present disclosure provides an OLED display panel. The panel includes a substrate, a plurality of light emitting components and light resistance structures on the substrate. The plurality of light emitting components is arranged in an array. The light resistance structures are between the plurality of light emitting components. Respective one of the plurality of light resistance structures prevents a reflected light of an emergent light from adjacent light emitting components, from emitting out from one side of the substrate between the adjacent light emitting components.

An embodiment of the present disclosure further provides a display device, including an OLED display panel. The OLED display panel includes: a substrate, a plurality of light emitting components and light resistance structures on the substrate. The plurality of light emitting components is arranged in an array. The light resistance structures are between the plurality of light emitting components. Respective one of the plurality of light resistance structures prevents a reflected light of an emergent light from adjacent light emitting components, from emitting out from one side of the substrate between the adjacent light emitting components.

DETAILED DESCRIPTION OF THE EMBODIMENTS

Figure 1:
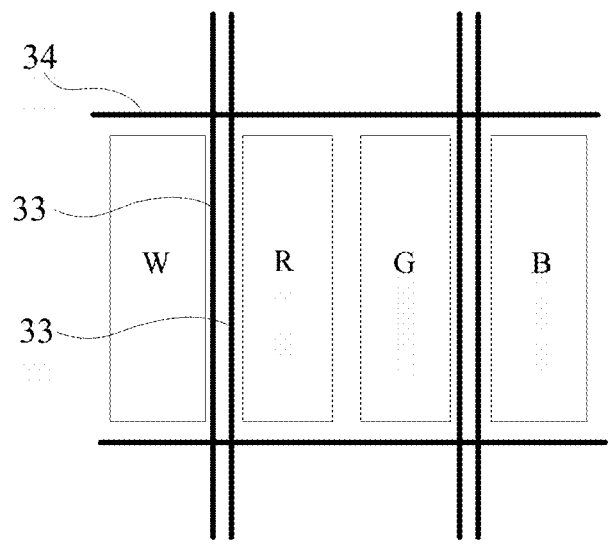
FIG. 1 is a partial top view of an OLED display panel provided by an embodiment of the present disclosure.

The technical solutions in the embodiments of the present disclosure will be described clearly and completely with reference to the accompanying drawings in the embodiments of the present disclosure. Obviously, the described embodiments are only a part of the embodiments of the present disclosure, but not all the embodiments. On the basis of the embodiments of the present disclosure, all other embodiments obtained by those of ordinary skill in the art without making creative efforts fall within the protection scope of the present disclosure.

As shown in FIGS. 1 and 3-8, the embodiments of the present disclosure provide an OLED display panel. The OLED display panel includes a substrate 1, a plurality of light emitting components 2 arranged in an array, and light resistance structures located between the light emitting components 2. The light resistance structure is, for example, a color resist 41 in FIGS. 3 and 4, a light absorbing element 42 in FIG. 5, a pixel defining structure 43 in FIG. 6, a first opening 44 and a second opening 45 in FIGS. 7 and 8. Specifically, the light resistance structure prevents, reflected light of the emergent light from the light emitting components 2, from emitting out from one side of the substrate 1 between the light emitting components 2.

Based on the above OLED display panel, one side of the substrate 1 serves as a display light emitting side, the light resistance structure is arranged between the light emitting components 2, and can prevent, reflected light of the emergent light from the light emitting components 2, from emitting out from the one side of the substrate 1 between the light emitting components 2. Therefore, light leakage of the OLED display panel can be avoided, and a display effect of the OLED display panel is improved.

Optionally, in a specific embodiment provided by the present disclosure, as shown in FIG. 3 to FIG. 8, each of the light emitting components 2 may include a source-drain electrode layer (metal layer), a color film 31 and a white OLED light emitting structure 32 disposed in that order on the substrate 1. The source-drain electrode layer (metal layer) may include structures such as a data line 33 and a source-drain electrode. The OLED light emitting structure 32 may include a cathode 323, a light emitting layer (EL) 322 and an anode 321.

Figure 2:
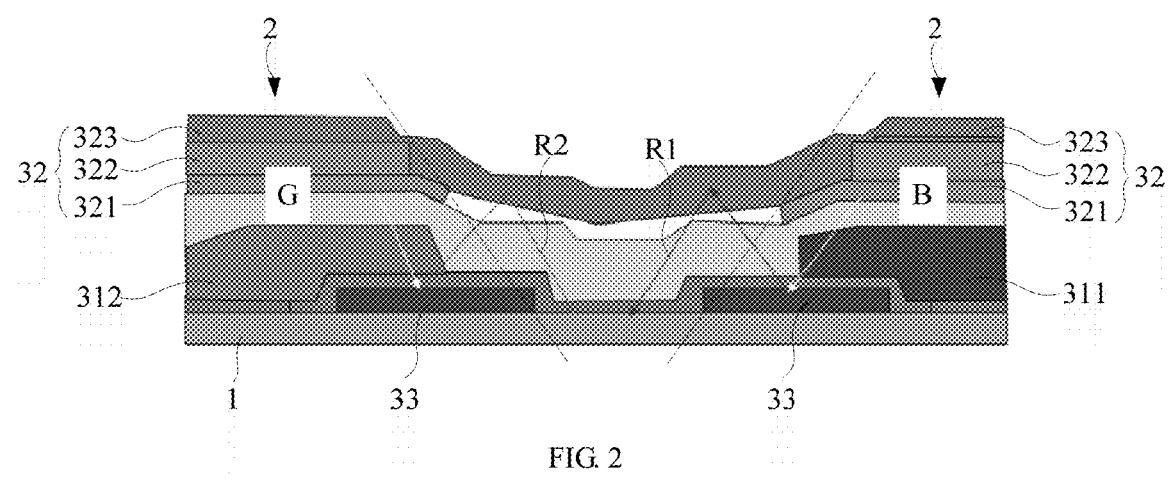
FIG. 2 is a partial cross-sectional view between two light emitting components of an OLED display panel in the related art.

In the related art, as shown in FIG. 2, by taking two adjacent B and G light emitting components 2 as an example, a B light emitting component 2 includes a source-drain electrode layer, a white OLED light emitting structure 32 and a blue color film 311, and a G light emitting component 2 includes a source-drain electrode layer, a white OLED light emitting structure 32 and a green color film 312. Specifically, light emitted by the light emitting structure 32 of the B light emitting component 2 is converted into blue light R1 through the blue color film 31. The blue light R1 reflected by the source-drain electrode layer easily enters the part between B and G pixels, and is reflected by the cathode 323 to the substrate 1, and then emits out. Similarly, green light R2 emitted from the G light emitting component 2 is also easily reflected to the substrate 1 between the B and G pixels and then emits out. On the basis of the above situation, the light leakage problem will occur.

Figure 3:
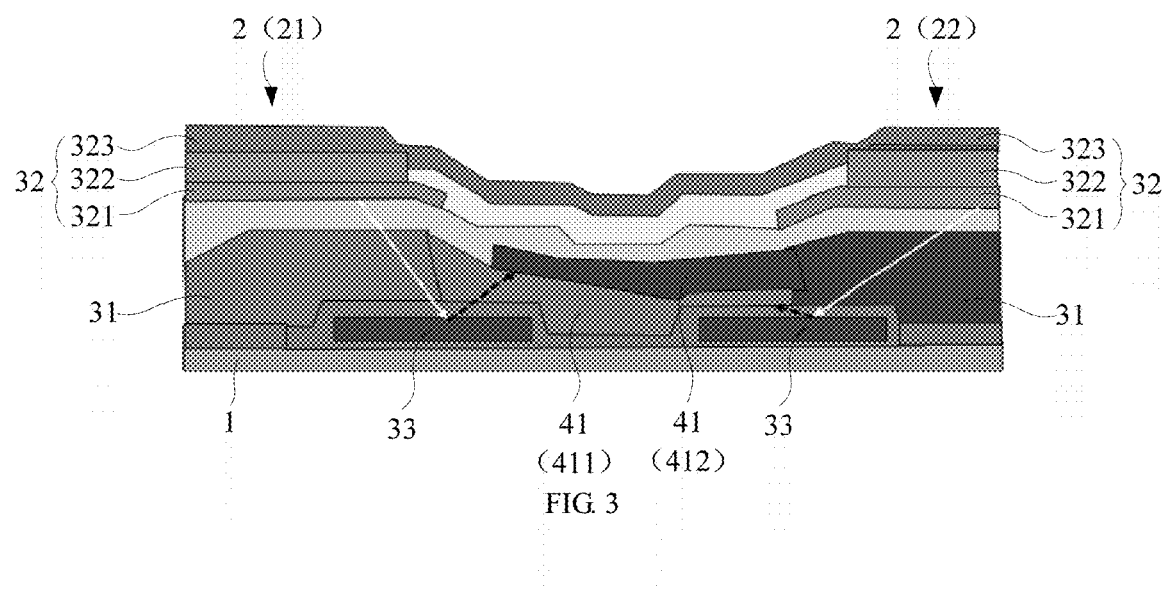
FIG. 3 is a partial cross-sectional view of an OLED display panel provided by an embodiment of the present disclosure.
Figure 4:
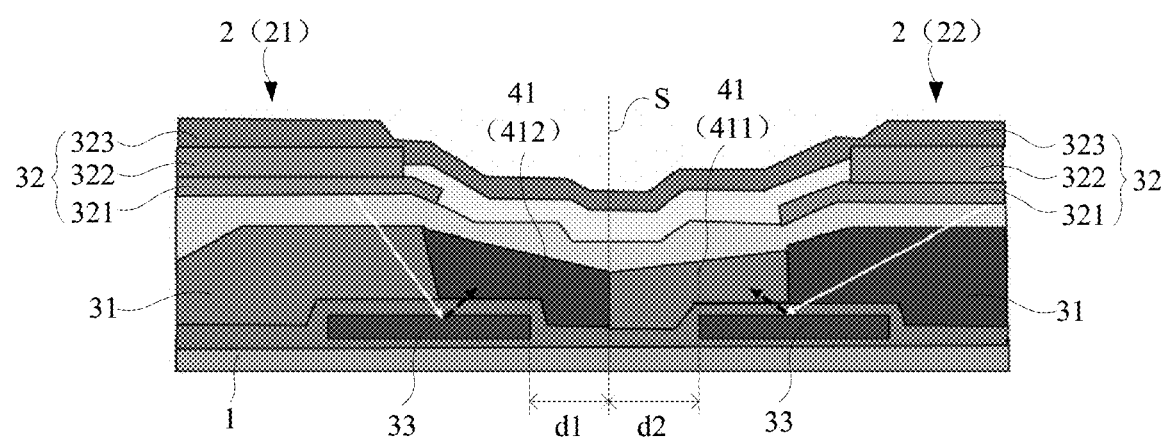
FIG. 4 is a partial cross-sectional view of an OLED display panel provided by another embodiment of the present disclosure.

Optionally, in a specific embodiment provided by the present disclosure, as shown in FIG. 3 and FIG. 4, the light resistance structure may include a color resist 41 between color films 31 of adjacent light emitting components 2, and the color resist 41 absorbs emergent light from the adjacent light emitting components 2.

Exemplarily, in a specific embodiment provided by the present disclosure, the color resist is different from the color films of the adjacent light emitting components in color. Emergent light from the light emitting components 2 is reflected by the source-drain electrode layer to a position between the adjacent light emitting components 2, then runs into the color resist 41 and is absorbed by the color resist 41, so that the phenomenon of light leakage can be avoided.

Exemplarily, in a specific embodiment provided by the present disclosure, if two adjacent light emitting components 2 are respectively referred as a first light emitting component 21 and a second light emitting component 22, the light resistance structure may include a first color resist 411 and a second color resist 412 between the first light emitting component 21 and the second light emitting component 22. The first color resist 411 and a color film 31 of the first light emitting component 21 have a same color and are prepared in a same layer, and the second color resist 412 and a color film 31 of the second light emitting component 22 have a same color and are prepared in a same layer.

Specifically, the first color resist 411 and the color film 31 of the first light emitting component 21 have a same color, and the second color resist 412 and the color film 31 of the second light emitting component 22 have a same color. Further, emergent light from the first light emitting component 21 is absorbed by the second color resist 412, and emergent light from the second light emitting component 22 is absorbed by the first color resist 411. Therefore, emergent lights from the adjacent first light emitting component 21 and second light emitting component 22 are absorbed in the area between the first light emitting component 21 and the second light emitting component 22 (dotted lines with arrows in FIG. 3 and FIG. 4 indicate no light transmission, that is, light is absorbed), so that the phenomenon of light leakage can be avoided. In addition, the first color resist 411 is prepared in the same layer as the first light emitting component 21, and the second color resist 412 is prepared in the same layer as the second light emitting component 22, so that no additional process step is required, and the preparation process is very simple.

Optionally, in a specific embodiment provided by the present disclosure, as shown in FIG. 3, the first color resist 411 and the second color resist 412 may be disposed in stack.

Optionally, in a specific embodiment provided by the present disclosure, as shown in FIG. 4, the first color resist 411 and the second color resist 412 may also be in a same layer. In this case, the first color resist 411 is between the second color resist 412 and the color film 31 of the second light emitting component 22, and the second color resist 412 is between the first color resist 411 and the color film 31 of the first light emitting component 21. Light of the first light emitting component 21 can reach the second color resist 412 adjacent thereto after being reflected by the source-drain electrode layer, and is absorbed by the second color resist 412; and light of the second light emitting component 22 can reach the first color resist 411 adjacent thereto after being reflected by the source-drain electrode layer, and is absorbed by the first color resist 411. This arrangement can not only avoid light leakage between adjacent pixels, but also avoid segment difference caused by overlapping color resist layers between pixels, and can ensure the uniformity of a color film process.

Specifically, in a specific embodiment provided by the present disclosure, the first color resist 411 and the second color resist 412 may be substantially same in size.

Exemplarily, in a specific embodiment provided by the present disclosure, as shown in FIGS. 1 and 4, for example, the first light emitting component 21 and the second light emitting component 22 are adjacent to each other in a row direction (an extending direction of a gate line 34), and data lines 33 of the first light emitting component 21 and the second light emitting component 22 are parallel and adjacently arranged. In this case, the first color resist 411 and the second color resist 412 may be partially between the data line 33 of the first light emitting component 21 and the data line 33 of the second light emitting component 22, and may partially cover parts of the data lines 33 and are connected to the color films 31 in the adjacent pixels. In addition, a distance d1 from a boundary line S between the first color resist 411 and the second color resist 412 to the data line 33 of the first light emitting component 21 is substantially equal to a distance d2 from the boundary line S to the data line 33 of the second light emitting component 22, that is, d1=d2.

Specifically, in a specific embodiment provided by the present disclosure, the OLED display panel of the present disclosure adopting an RGBW pixel arrangement mode is taken as an example, as shown in FIG. 1, in this case, the first light emitting component 21 and the second light emitting component 22 may be an R light emitting component and a G light emitting component, or a G light emitting component and a B light emitting component.

Optionally, in a specific embodiment provided in the present disclosure, the light resistance structure may include a black light absorbing structure between the source-drain electrode layers of the adjacent light emitting components 2. Specifically, when emergent light from the light emitting components is reflected toward the substrate between the adjacent light emitting components, the emergent light runs into the black light absorbing structure and is absorbed, so that the phenomenon of light leakage can be avoided.

Figure 5:
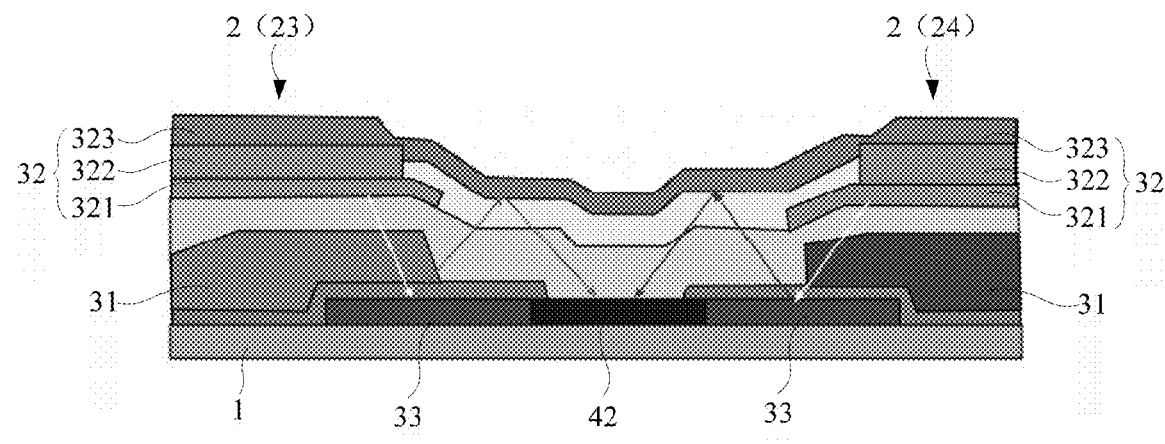
FIG. 5 is a partial cross-sectional view of an OLED display panel provided by another embodiment of the present disclosure.

Exemplarily, in a specific embodiment provided by the present disclosure, as shown in FIGS. 1 and 5, two adjacent light emitting components 2 are respectively referred as a third light emitting component 23 and a fourth light emitting component 24, the third light emitting component 23 and the fourth light emitting component 24 are adjacent to each other in a row direction (an extending direction of a gate line 34), and data lines 33 of the third light emitting component 23 and the fourth light emitting component 24 are arranged in parallel and adjacently. The black light absorbing structure may include a light absorbing element 42 between the data line 33 of the third light emitting component 23 and the data line 33 of the fourth light emitting component 24. Specifically, light from the third light emitting component 23 reaches the cathode 323 after being reflected by the data line 33, then may reach the light absorbing element 42 to be absorbed after being reflected by the cathode 323. In the same way, light from the fourth light emitting component 24 can reach the light absorbing element 42 after being reflected by the cathode 323 and be absorbed. Therefore, emergent light from the adjacent third light emitting component 23 and fourth light emitting component 24 is absorbed in the part between the third light emitting component 23 and the fourth light emitting component 24, so that the phenomenon of light leakage can be avoided.

Exemplarily, in a specific embodiment provided by the present disclosure, the OLED display panel of the present disclosure adopting an RGBW pixel arrangement mode is taken as an example, as shown in FIG. 1, in this case, the third light emitting component 23 and the fourth light emitting component 24 may be an R light emitting component and a G light emitting component, or may be a G light emitting component and a B light emitting component, or may be a B light emitting component and a W light emitting component, or may be a W light emitting component and an R light emitting component.

Figure 6:
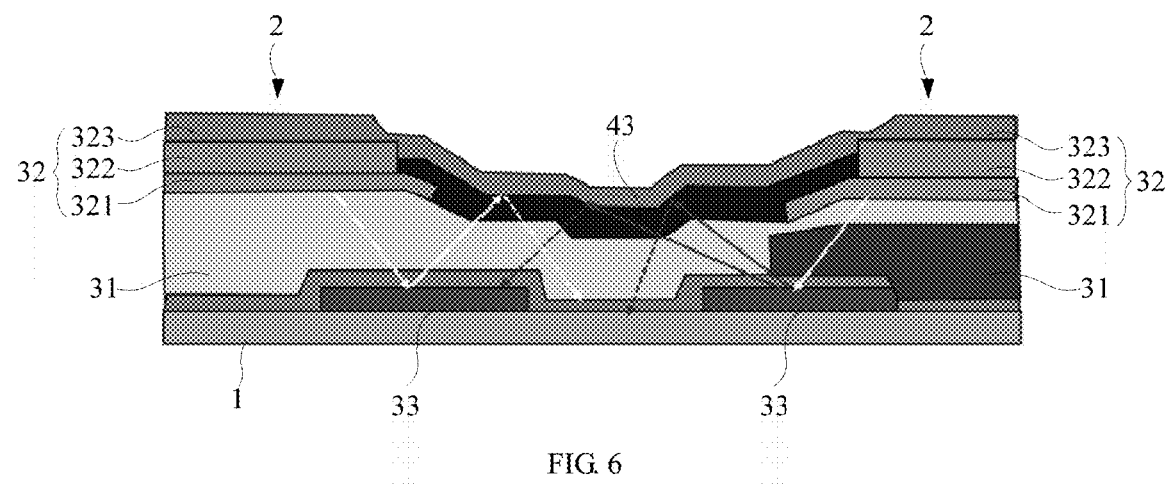
FIG. 6 is a partial cross-sectional view of an OLED display panel provided by another embodiment of the present disclosure.

Optionally, in a specific embodiment provided by the present disclosure, as shown in FIG. 6, the light resistance structure may include a pixel defining structure 43 between the light emitting components 2. The pixel defining structure 43 is made of a light absorbing material, for example, may be a black light absorbing material. Specifically, when emergent light from the light emitting components 2 reaches the pixel defining structure 43 after being reflected by the source-drain electrode layer, the emergent light is absorbed by the pixel defining structure 43 to avoid being reflected to one side of the substrate 1 (dotted lines with arrows in FIG. 6 indicate no light transmission, that is, light is absorbed), so that the phenomenon of light leakage can be avoided.

Exemplarily, in a specific embodiment provided by the present disclosure, the OLED display panel of the present disclosure adopting an RGBW pixel arrangement mode is taken as an example, as shown in FIG. 1, in this case, the light resistance structure may include a whole entire pixel defining layer, or may only include at least part of the pixel defining structure between the R light emitting component and the G light emitting component, between the G light emitting component and the B light emitting component, between the B light emitting component and the W light emitting component, and between the W light emitting component and the R light emitting component. In other words, the whole pixel defining layer may be made of the black light absorbing material, or the pixel defining structure between some pixels may be made of the black light absorbing material.

Figure 7:
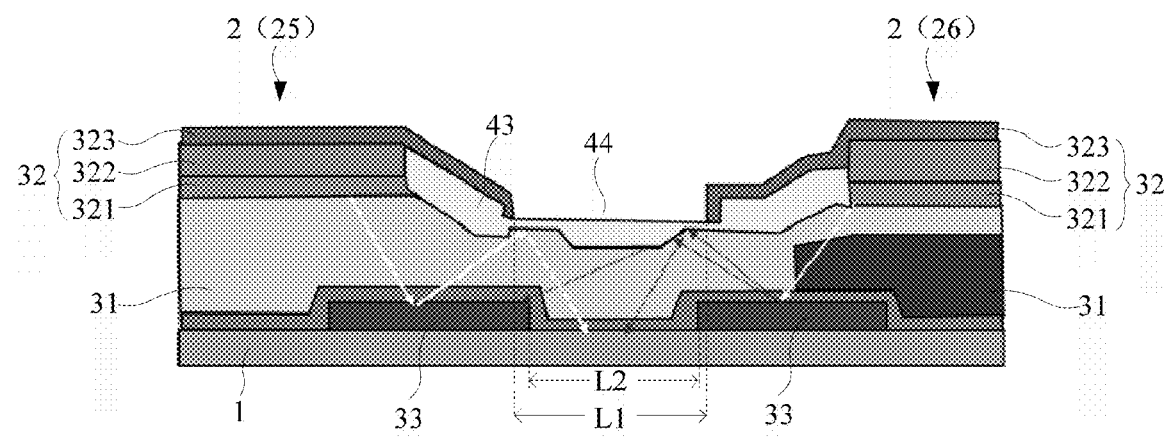
FIG. 7 is a partial cross-sectional view of an OLED display panel provided by another embodiment of the present disclosure.
Figure 8:
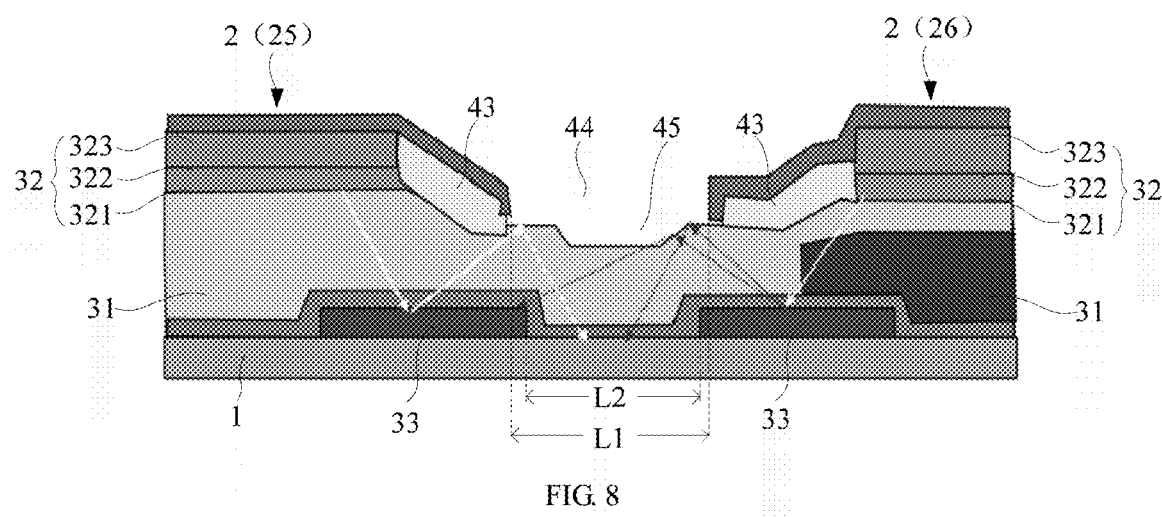
FIG. 8 is a partial cross-sectional view of an OLED display panel provided by another embodiment of the present disclosure.

Optionally, in a specific embodiment provided by the present disclosure, as shown in FIG. 7 and FIG. 8, the light emitting structure 32 of each light emitting component 2 may include an anode 321, a light emitting layer 322, and a cathode 323 in that order disposed on the substrate 1. The cathodes 323 of the plurality of light emitting components 2 constitute a common and integral electrode layer 323. Exemplarily, the light resistance structure may include a first opening 44 in the integral electrode layer 323. The first opening 44 is located at an area corresponding to a part between the adjacent light emitting components 2. That is, the cathode 323 layer is provided with an opening corresponding to the part between the adjacent light emitting components 2. Specifically, when emergent light from the light emitting components 2 reaches the first opening 44 of the cathode 323 layer after being reflected by the source-drain electrode layer, the emergent light directly emits out from the first opening 44 to avoid being reflected to one side of the substrate 1 (dotted lines with arrows in FIG. 7 and FIG. 8 indicate no light transmission, that is, light is absorbed), so that light can be prevented from emitting out from one side of the substrate 1 and the phenomenon of light leakage can be avoided.

Exemplarily, in a specific embodiment provided by the present disclosure, as shown in FIG. 8, the light resistance structure may further include a second opening 45 in the pixel defining structure 43. A projection of the second opening 45 on the substrate 1 covers a projection of the first opening 44 on the substrate 1. Specifically, a position of the second opening 45 corresponds to a position of the first opening 44, and a size of the second opening 45 may be greater than or equal to a size of the first opening 44. The second opening 45 in the pixel defining structure 43 can prevent light from being reflected to one side of the substrate 1 by the pixel defining structure 43, so that the phenomenon of light leakage can be further avoided.

Exemplarily, in a specific embodiment provided by the present disclosure, each light emitting component 2 includes a source-drain electrode layer between the substrate 1 and the anode 321, and the source-drain electrode layer includes a data line 33. As shown in FIGS. 1, 7 and 8, if two adjacent light emitting components 2 are respectively referred as a fifth light emitting component 25 and a sixth light emitting component 26, the fifth light emitting component 25 and the sixth light emitting component 26 are adjacent to each other in a row direction (an extending direction of a gate line 34), and data lines 33 of the fifth light emitting component 25 and the sixth light emitting component 26 are arranged in parallel and adjacently. The first opening 44 is formed at a position corresponding to a part between the fifth light emitting component 25 and the sixth light emitting component 26. A width L1 of the first opening 44 is greater than a distance L2 from the data line 33 of the fifth light emitting component 25 to the data line 33 of the sixth light emitting component 26, which can better prevent light leakage and light mixing between the fifth light emitting component 25 and the sixth light emitting component 26.

Exemplarily, in a specific embodiment provided by the present disclosure, the OLED display panel of the present disclosure adopting an RGBW pixel arrangement mode is taken as an example, as shown in FIG. 1. In this case, the fifth light emitting component 25 and the sixth light emitting component 26 may be an R light emitting component and a G light emitting component, or may be a G light emitting component and a B light emitting component, or may be a B light emitting component and a W light emitting component, or may be a W light emitting component and an R light emitting component.

Specifically, the OLED display panel of the present disclosure takes one side of the substrate as a display light emitting side and is a bottom emitting OLED. Exemplarily, the OLED display panel can be either in an RGBW pixel arrangement mode or an RGB pixel arrangement mode. Moreover, the color display of the OLED display panel can be implemented by either a white light OLED+color film, or a monochrome OLED light emitting (red OLED+green OLED+blue OLED), which is not limited in the present disclosure.

In addition, the light resistance structure in the embodiments provided by the present disclosure may include one or more of the color resist 41 in FIGS. 3 and 4, the light absorbing element 42 in FIG. 5, the pixel defining structure 43 in FIG. 6, the first opening 44 and the second opening 45 in FIGS. 7 and 8. The embodiments of the present disclosure only give illustrative description of the light resistance structure, and not all the embodiments of the present disclosure. In fact, structures configured to prevent emergent light from the light emitting components from emitting out from one side of the substrate between the light emitting components after being reflected fall within the protection scope of the light resistance structure of the present disclosure.

On the basis of the same inventive concept, an embodiment of the present disclosure further provides a display device, the display device including any one of the above OLED display panels. The display device can be applied to any product or component with a display function, such as a mobile phone, a tablet personal computer, a television, a display, a notebook computer, a digital photo frame and a navigator. Since the principle of the display device for solving the problem is similar to that of the above display panel, the implementation of the display device can refer to the implementation of the above display panel, and repeated descriptions are omitted.

Obviously, those skilled in the art can make various modifications and variations to the embodiments of the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. An Organic Light Emitting Diode, OLED, display panel, comprising:
a substrate;
a plurality of light emitting components arranged in an array on the substrate; and
light resistance structures between the plurality of light emitting components on the substrate;
wherein respective one of the plurality of light resistance structures prevents a reflected light of an emergent light from adjacent light emitting components, from emitting out from a side of the substrate between the adjacent light emitting components,
wherein each of the plurality of light emitting components comprises a color film and a light emitting structure disposed in that order on the substrate; wherein
the light resistance structure comprises a color resist between color films of the adjacent light emitting components, and the color resist absorbs emergent light from the adjacent light emitting components;
an orthographic projection of the color resist and an orthographic projection of the color film on a direction perpendicular to the substrate have an overlapping area.

2. The OLED display panel according to claim 1, wherein the color resist is different from the color films of the adjacent light emitting components in color.

3. The OLED display panel according to claim 1, wherein in a case that two adjacent light emitting components are respectively a first light emitting component and a second light emitting component:
the light resistance structure comprises a first color resist and a second color resist between the first light emitting component and the second light emitting component; wherein
the first color resist and a color film of the first light emitting component have a same color and are prepared in a same layer; and
the second color resist and a color film of the second light emitting component have a same color and are prepared in a same layer.

4. The OLED display panel according to claim 3, wherein the first color resist and the second color resist are disposed in stack.

5. The OLED display panel according to claim 3, wherein the first color resist is between the second color resist and the color film of the second light emitting component; and
the second color resist is between the first color resist and the color film of the first light emitting component.

6. The OLED display panel according to claim 5, wherein each of the light emitting components further comprises a source-drain electrode layer between the substrate and the color film, wherein the source-drain electrode layer comprises a data line;
wherein
data lines of the first light emitting component and the second light emitting component are parallel and adjacent to each other; and
a boundary line between the first color resist and the second color resist is spaced from a data line of the first light emitting component and a data line of the second light emitting component by a same distance.

7. The OLED display panel according to claim 1, wherein each of the plurality of light emitting components comprises a source-drain electrode layer and a light emitting structure disposed in that order on the substrate; wherein
the light resistance structure comprises a black light absorbing structure between source-drain electrode layers of the adjacent light emitting components.

8. The OLED display panel according to claim 7, wherein the source-drain electrode layer comprises a data line; and
in a case that two adjacent light emitting components are respectively a third light emitting component and a fourth light emitting component:
data lines of the third light emitting component and the fourth light emitting component are parallel and adjacent to each other; and
the black light absorbing structure comprises a light absorbing element between a data line of the third light emitting component and a data line of the fourth light emitting component.

9. The OLED display panel according to claim 1, wherein the light resistance structure comprises a pixel defining structure between the adjacent light emitting components; wherein
the pixel defining structure is made of a light absorbing material.

10. The OLED display panel according to claim 1, wherein
each of the plurality of light emitting components comprises an anode, a light emitting layer, and a cathode disposed in that order on the substrate; wherein
cathodes of the plurality of light emitting components constitute a common and integral electrode layer; and
the light resistance structure comprises a first opening in the integral electrode layer; wherein a projection of the first opening on the substrate is located in a projection of a part between the adjacent light emitting components on the substrate.

11. The OLED display panel according to claim 10, further comprising;
a pixel defining structure between the adjacent light emitting components; wherein
the light resistance structure comprises a second opening in the pixel defining structure; wherein
a projection of the second opening on the substrate covers a projection of the first opening on the substrate.

12. The OLED display panel according to claim 10, wherein
each of the light emitting components further comprises a source-drain electrode layer between the substrate and the anode, wherein the source-drain electrode layer comprises a data line;
wherein
in a case that two adjacent light emitting components are respectively a fifth light emitting component and a sixth light emitting component:
data lines of the fifth light emitting component and the sixth light emitting component are parallel and adjacent to each other; and
the first opening is formed between the fifth light emitting component and the sixth light emitting component; and
a width of the first opening is greater than a distance from a data line of the fifth light emitting component to a data line of the sixth light emitting component.

13. A display device, comprising an OLED display panel, wherein the OLED display comprises:
a substrate;
a plurality of light emitting components arranged in an array on the substrate; and
light resistance structures between the plurality of light emitting components on the substrate;
wherein respective one of the plurality of light resistance structures prevents a reflected light of an emergent light from adjacent light emitting components, from emitting out from a side of the substrate between the adjacent light emitting components,
wherein each of the plurality of light emitting components comprises a color film and a light emitting structure disposed in that order on the substrate; wherein
the light resistance structure comprises a color resist between color films of the adjacent light emitting components, and the color resist absorbs emergent light from the adjacent light emitting components;
an orthographic projection of the color resist and an orthographic projection of the color film on a direction perpendicular to the substrate have an overlapping area.

14. The display device according to claim 13, wherein each of the plurality of light emitting components comprises a source-drain electrode layer and a light emitting structure disposed in that order on the substrate; wherein
the light resistance structure comprises a black light absorbing structure between source-drain electrode layers of the adjacent light emitting components.

15. The display device according to claim 13, wherein the light resistance structure comprises a pixel defining structure between the adjacent light emitting components; wherein
the pixel defining structure is made of a light absorbing material.

16. The display device according to claim 13, wherein each of the plurality of light emitting components comprises an anode, a light emitting layer, and a cathode disposed in that order on the substrate; wherein
cathodes of the plurality of light emitting components constitute a common and integral electrode layer; and
the light resistance structure comprises a first opening in the integral electrode layer; wherein
a projection of the first opening on the substrate is located in a projection of a part between the adjacent light emitting components on the substrate.

* * * * *